(12) United States Patent
Jang et al.

(10) Patent No.: US 7,998,850 B2
(45) Date of Patent: Aug. 16, 2011

(54) SEMICONDUCTOR DEVICE AND METHOD FOR MANUFACTURING THE SAME

(75) Inventors: Chi Hwan Jang, Icheon-si (KR); Tae Yeon Yeo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 231 days.

(21) Appl. No.: 12/327,346

(22) Filed: Dec. 3, 2008

(65) Prior Publication Data

US 2009/0273025 A1    Nov. 5, 2009

(30) Foreign Application Priority Data

May 2, 2008    (KR) .................. 10-2008-0041443

(51) Int. Cl.
 *H01L 21/3205* (2006.01)
 *H01L 21/4763* (2006.01)

(52) U.S. Cl. ........................... 438/585; 977/742
(58) Field of Classification Search ............. 257/330, 257/751, E29.255; 438/270, 132, 4, 587, 438/689, 694, 858; 977/742, 936, 938
See application file for complete search history.

(56) References Cited

U.S. PATENT DOCUMENTS

| 7,084,507 B2 | 8/2006 | Awano | |
|---|---|---|---|
| 2003/0011036 A1* | 1/2003 | Bethune et al. | 257/410 |
| 2004/0016928 A1* | 1/2004 | Ravi et al. | 257/77 |
| 2004/0023431 A1 | 2/2004 | Wang et al. | |

FOREIGN PATENT DOCUMENTS

| JP | 10-261659 | * 9/1998 |
|---|---|---|
| KR | 10-2006-0023064 | 3/2006 |
| KR | 10-2006-0029547 | 4/2006 |
| KR | 10-2007-0117666 | 12/2007 |

OTHER PUBLICATIONS

M. Quirk et al., "Semiconductor manufacturing technology", 2001, Printice-Hall. Inc, pp. 435-445, Table 16.5).*

* cited by examiner

*Primary Examiner* — Thomas L Dickey
*Assistant Examiner* — Nikolay Yushin
(74) *Attorney, Agent, or Firm* — Marshall, Gerstein & Borun LLP

(57) ABSTRACT

Disclosed herein are a semiconductor device and a method for manufacturing the same. The method includes forming a gate structure using a carbon nano tube (CNT). In order to prevent reduction of the gate resistance and the short channel effect, a CNT gate having a grown CNT pattern with a half-cylinder shape is formed over a recess of a semiconductor substrate. The CNT gate has the same effect as a recess gate, and can prevent the short channel effect, improve the speed, and the lower power characteristic of semiconductor devices.

8 Claims, 5 Drawing Sheets

SEMICONDUCTOR DEVICE AND METHOD FOR MANUFACTURING THE SAME

CROSS-REFERENCE TO RELATED APPLICATION

Priority to Korean patent application number 10-2008-0041443 filed May 2, 2008, the disclosure of which is incorporated herein by reference in its entirety, is claimed.

BACKGROUND OF THE INVENTION

Depending on electric characteristics, nano tubes can be embodied into electric elements such as diodes and transistors. A carbon nano tube (CNT), for example, is a graphite hollow cylinder having a diameter on the order of several angstroms. Structurally, the CNT is similar to a hexagonal lattice of cylinder-type carbon. The CNT has a quantum characteristic at a low temperature, and the characteristics of a metal or a semiconductor, depending on its chirality.

The metal type CNT can carry a current of high density with a given resistance. The semiconductor type CNT can be switched on and off like a field effect transistor (FET). The two types of nano tubes can also be combined (sharing electrons). Due to these characteristics, the CNT is an optimum material for the fabrication of a nano-meter-sized semiconductor circuit. The CNT can be, for example, a one-dimensional electric conductor, which means that a one-dimensional quantum mechanical mode carries a current.

A CNT based transistor has advantageous electrical properties because diffusion in the material is inhibited, which can enhance device performance.

In the manufacturing of semiconductor devices, a gate of the current transistor generally includes gate forming materials such as tungsten (W), polysilicon, poly germanium silicide, and tungsten silicide. However, because these gate forming materials have a large resistance, the whole speed of the transistor is reduced and power consumption is increased. Additionally, when the size of the semiconductor is decreased by a conventional method, a resistance of a gate is increased. Thus, it is necessary to develop improved materials.

CNTs have been proposed as new gate forming materials to overcome the problems resulting from the scale-down of semiconductors. A method for forming a gate using a CNT, however, has not been commercialized.

In the conventional method for forming a CNT, the CNT has a cylinder structure, so that a contact surface with silicon (Si) becomes narrow. As a result, it is difficult to control subsequent processes after formation of the CNT gate. It is also necessary to prevent a short channel effect.

SUMMARY OF THE INVENTION

Various embodiments of the disclosure are directed to providing a semiconductor device and a method for manufacturing the same. The method includes forming a gate structure using a CNT. By forming the gate using a CNT pattern having a half-cylinder shape, a gate resistance is reduced and a short channel effect is prevented.

According to an embodiment of the invention, a semiconductor device includes a semiconductor substrate comprising a recess, an insulating film disposed over the semiconductor substrate including the recess, and a CNT gate disposed over the recess including the insulating film. The CNT gate includes a grown CNT pattern having a half-cylinder shape and an insulating material formed over the grown CNT pattern.

According to an embodiment of the invention, a method for manufacturing a semiconductor device includes etching a recess region of a semiconductor substrate to form a recess; and forming an insulating film over the substrate including the recess. The method further includes forming a CNT seed layer over the insulating layer, and etching the CNT seed layer to form a CNT pattern. Still further the method includes growing the CNT pattern to form a grown CNT pattern. The method further includes forming an insulating material over the grown CNT pattern to form a CNT gate.

Preferably, the recess is formed by an isotropic-etching process.

Preferably, the CNT seed layer is formed by a process selected from the group consisting of chemical vapor deposition (CVD), physical vapor deposition (PVD), atomic layer deposition (ALD), electricity, laser, plasma, vapor synthesis, electrolysis, and combinations thereof.

Preferably, the CNT pattern is horizontally grown.

Preferably, the insulating material includes a material selected from the group consisting of an oxide film, a nitride film, and a stacked structure thereof.

The method can further include etching the insulating material using a CNT gate mask.

Additional features of the invention may become apparent to those having ordinary skill in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings.

Figure 1A:
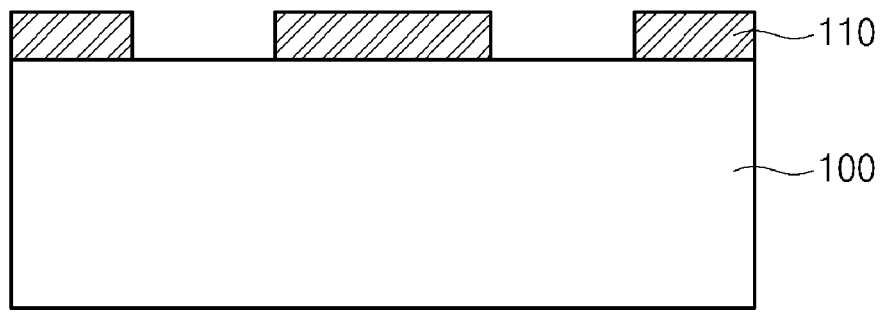
FIGS. 1$a$ to 1$j$ are cross-sectional views illustrating a semiconductor device and a method for manufacturing a semiconductor device according to an embodiment of the disclosure.
Figure 1B:
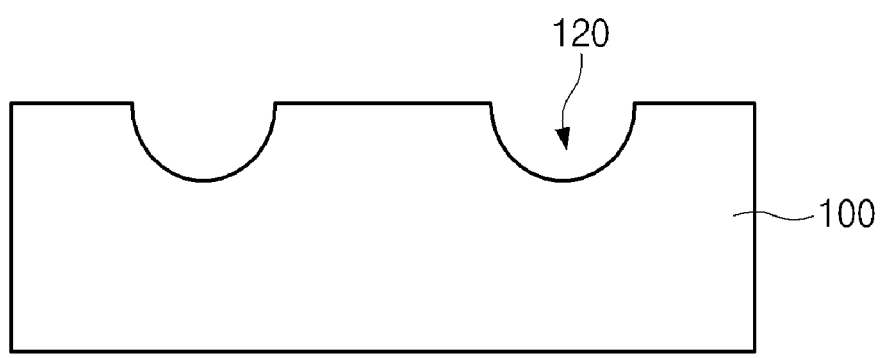
Figure 1C:
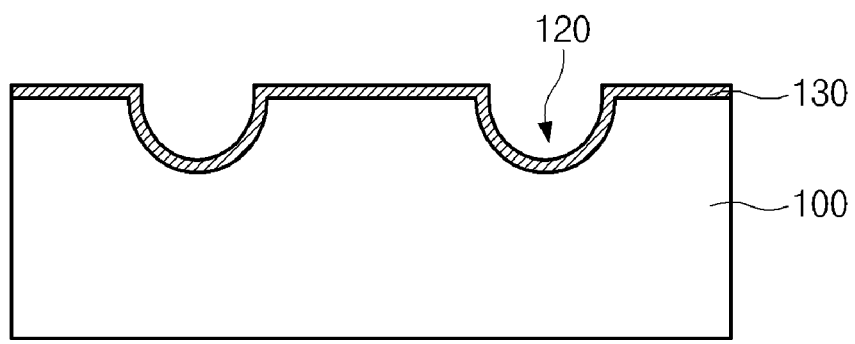
Figure 1D:
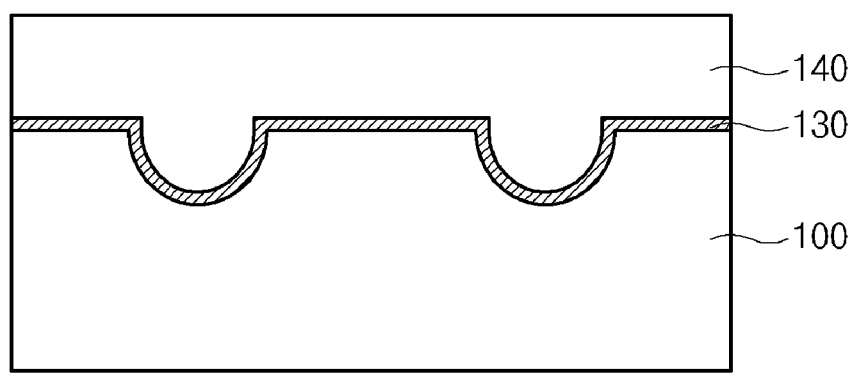

While the disclosed device and method are susceptible of embodiments in various forms, a specific embodiment is illustrated in the drawings (and will hereafter be described), with the understanding that the disclosure is intended to be illustrative, and is not intended to limit the invention to the specific embodiment described and illustrated herein.

DETAILED DESCRIPTION OF SPECIFIC EMBODIMENT

The invention will be described in detail with reference to the drawings. In the drawings, the thickness of layers and regions is exaggerated for clarity, and a layer can be directly formed over a different layer or a substrate or a third layer can be formed between the different layer and the substrate.

Referring to FIG. 1$a$, a photoresist film (not shown) is formed over a semiconductor substrate 100. A first photoresist pattern 110 can be formed, for example, by performing an exposing and developing process on the photoresist film, using a recess mask (not shown).

Referring to FIG. 1$b$, the semiconductor substrate 100 is etched using the first photoresist pattern 110 as an etching mask to form a recess 120. The recess 120 can be formed, for example, by an isotropic etching process.

Referring to FIGS. 1$c$ and 1$d$, an insulating film 130 is formed over the semiconductor substrate 100 including the recess 120. A CNT seed layer 140 is formed over the insulating film 130. The CNT seed layer 140 can be formed, for example, by chemical vapor deposition (CVD) using CH4, C2H6 or C4H8 gas including carbon in range of 200° C. to 1000° C., physical vapor deposition (PVD), atomic layer deposition (ALD), electricity, laser, plasma, vapor synthesis, electrolysis, and combinations thereof.

Figure 1E:
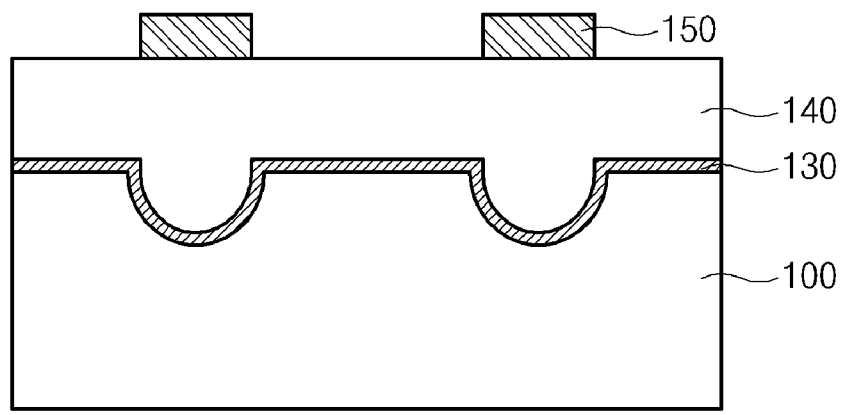

A photoresist film (not shown) is formed over the CNT seed layer 140. Referring to FIG. 1e, a second photoresist pattern 150 can be formed, for example, by performing an exposing and developing process on the photoresist layer using a CNT pattern mask.

Figure 1F:
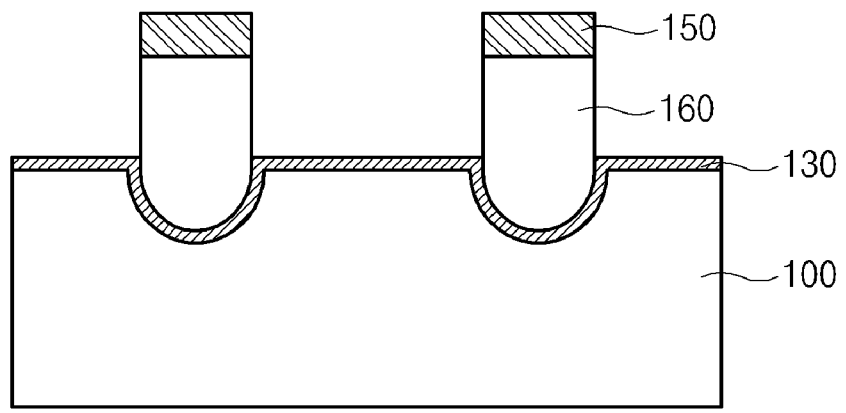

Referring to FIG. 1f, the CNT seed layer 140 is etched using the second photoresist pattern 150 as an etching mask to form a CNT pattern 160.

Figure 1G:
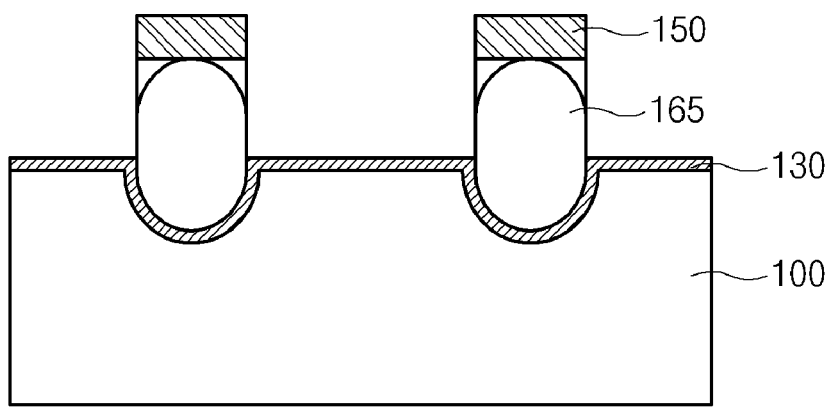

Referring to FIG. 1g, the CNT pattern 160 is grown to form a grown CNT pattern 165 having a half-cylinder shape. It is preferable not to remove the second photoresist pattern 150 located over the CNT pattern 160 before growing the grown CNT pattern 165. Preferably, the CNT pattern 160 is grown horizontally.

Figure 1H:
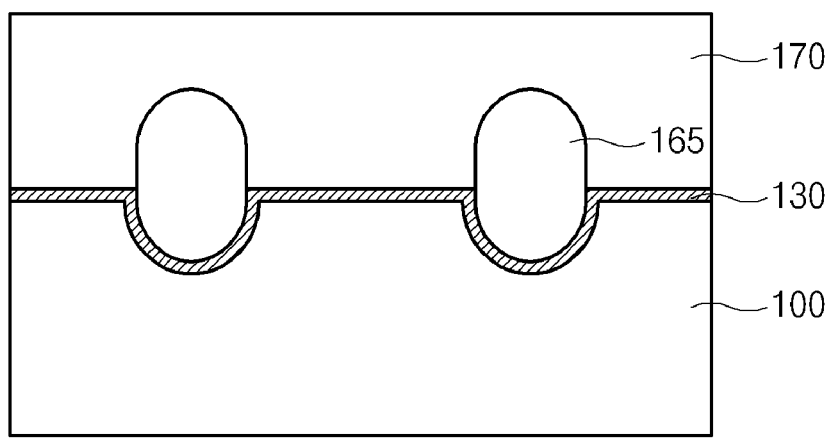

Referring to FIG. 1h, an insulating material 170 is formed over the semiconductor substrate 100, including the grown CNT pattern 165. The second photoresist pattern 150 can be removed before forming the insulating material 170. The insulating material 170 can include, for example, an oxide film, a nitride film, or a stacked structure thereof.

Figure 1I:
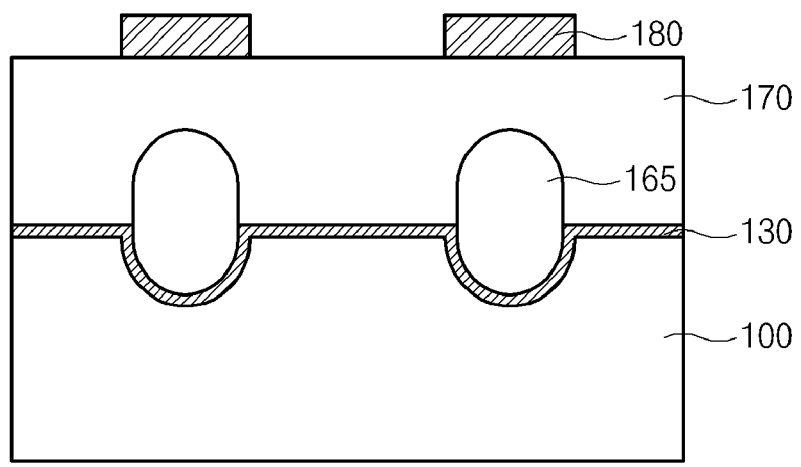
Figure 1J:
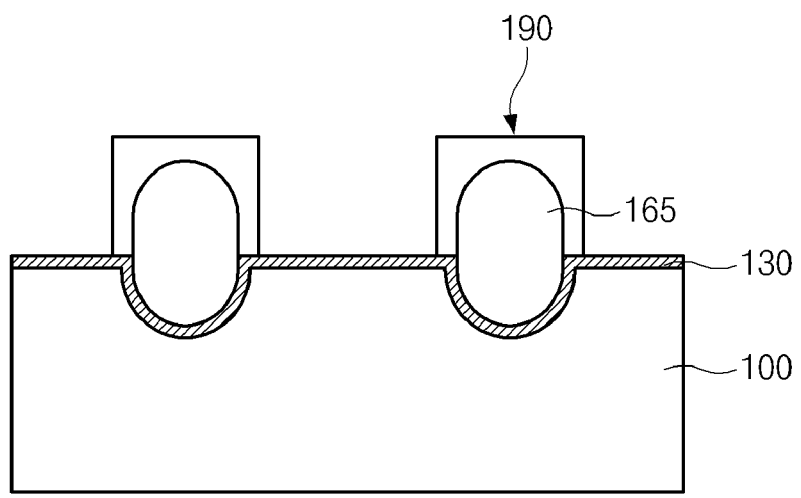

A photoresist film (not shown) is formed over the insulating material 170. Referring to FIGS. 1i and 1j, a third photoresist pattern 180 can be formed, for example, by performing an exposing and developing process on the photoresist film, using a CNT gate mask. The insulating material 170 is etched using the third photoresist pattern 180 as an etching mask to form a CNT gate 190.

In accordance with an embodiment of the invention, a method for manufacturing a semiconductor device includes etching a recess region of a semiconductor substrate 100 to form a recess 120 and forming an insulating film 130 and a CNT seed layer 140 over the substrate 100 including the recess 120. The method further includes etching the CNT seed layer 140 using a CNT pattern mask as an etching mask to form a CNT pattern 160 and growing the CNT pattern 160 to form a grown CNT pattern 165. The method also includes forming an insulating material 170 over the grown CNT pattern 165 to form a CNT gate 190. The method can further include etching the insulating material 170 using a CNT gate mask as an etching mask.

The above embodiments of the disclosure are illustrative and not limitative. Various alternatives and equivalents are possible. The invention is not limited by the type of deposition, etching polishing, and patterning steps described herein.

Nor is the invention limited to any specific type of semiconductor device. For example, the disclosure may be implemented in a dynamic random access memory (DRAM) device or a nonvolatile memory device. Other additions, subtractions, or modifications are obvious in view of the present disclosure and are intended to fall within the scope of the appended claims.

What is claimed is:

1. A method for manufacturing a semiconductor device, the method comprising:
    etching a recess region of a semiconductor substrate to form a recess;
    forming an insulating film over the semiconductor substrate including the recess;
    forming a carbon nano tube seed layer over the insulating film;
    etching the carbon nano tube seed layer to form a carbon nano tube pattern;
    growing the carbon nano tube pattern to form a grown carbon nano tube pattern; and
    forming an insulating material over the grown carbon nano tube pattern to form a carbon nano tube gate.

2. The method according to claim 1, further comprising etching the insulating material for having a half-cylinder shape.

3. The method according to claim 1, comprising forming the recess by an isotropic-etching process.

4. The method according to claim 1, comprising forming the carbon nano tube seed layer by a process selected from the group consisting of chemical vapor deposition (CVD), physical vapor deposition (PVD) atomic layer deposition (ALD), electricity, laser, plasma, vapor synthesis, electrolysis, and combinations thereof.

5. The method according to claim 1, wherein etching the carbon nano tube seed layer comprises using a carbon nano tube pattern mask as an etching mask.

6. The method according to claim 1, comprising horizontally growing the carbon nano tube pattern.

7. The method according to claim 1, wherein the insulating material comprises a material selected from the group consisting of an oxide film, a nitride film, and a stacked structure thereof.

8. The method according to claim 1 further comprising:
    etching the insulating material using a carbon nano tube gate mask to form the carbon nano tube gate.

* * * * *